United States Patent
Yuen

(10) Patent No.: US 10,243,097 B2
(45) Date of Patent: Mar. 26, 2019

(54) FLUIDIC ASSEMBLY USING TUNABLE SUSPENSION FLOW

(71) Applicant: Sharp Laboratories of America, Inc., Camas, WA (US)

(72) Inventor: Po Ki Yuen, Painted Post, NY (US)

(73) Assignee: eLux Inc., Vancouver, WA (US)

( * ) Notice: Subject to any disclaimer, the term of this patent is extended or adjusted under 35 U.S.C. 154(b) by 168 days.

(21) Appl. No.: 15/260,417

(22) Filed: Sep. 9, 2016

(65) Prior Publication Data
US 2018/0076068 A1    Mar. 15, 2018

(51) Int. Cl.
*H01L 33/00*    (2010.01)
*G05D 7/06*    (2006.01)

(52) U.S. Cl.
CPC ........... *H01L 33/00* (2013.01); *G05D 7/0694* (2013.01); *H01L 2224/95085* (2013.01)

(58) Field of Classification Search
CPC ......... H01L 3/00; H01L 33/00; G05D 7/0676; G05D 7/0629; G05D 7/0617; G05D 7/06
USPC .......................................... 422/502, 500, 50
See application file for complete search history.

(56) References Cited

U.S. PATENT DOCUMENTS

| | | | |
|---|---|---|---|
| 5,117,749 A * | 6/1992 | Bakker | A21C 9/08 118/16 |
| 5,355,577 A | 10/1994 | Cohn | |
| 5,545,291 A | 8/1996 | Smith et al. | |
| 5,696,389 A | 12/1997 | Ishikawa et al. | |
| 5,904,545 A * | 5/1999 | Smith | G02F 1/1362 216/108 |
| 6,527,964 B1 | 3/2003 | Smith et al. | |
| 6,566,744 B2 | 5/2003 | Gengel | |
| 6,623,579 B1 * | 9/2003 | Smith | B82Y 30/00 156/73.6 |
| 6,771,019 B1 | 8/2004 | Wu et al. | |
| 6,821,805 B1 | 11/2004 | Nakamura et al. | |
| 6,927,382 B2 | 8/2005 | King et al. | |
| 7,528,422 B2 | 5/2009 | Murphy | |
| 7,589,355 B2 | 9/2009 | Tomoda et al. | |
| 7,687,277 B2 | 3/2010 | Sharma et al. | |
| 7,727,788 B2 | 6/2010 | Han et al. | |
| 7,727,804 B2 | 6/2010 | Smith | |
| 7,874,474 B2 | 1/2011 | Kim et al. | |
| 7,928,655 B2 | 4/2011 | Lin et al. | |
| 7,931,063 B2 | 4/2011 | Craig et al. | |
| 8,076,178 B2 | 11/2011 | Krishnamoorthy et al. | |
| 8,318,595 B2 | 11/2012 | Morris et al. | |

(Continued)

FOREIGN PATENT DOCUMENTS

| | | |
|---|---|---|
| JP | 2006-278511 | 10/2006 |
| JP | 11-186590 | 7/2007 |
| JP | 2007-294566 | 11/2007 |

OTHER PUBLICATIONS

Merriam-Webster.com definition of 'Chamber'. Merriam-Webster.com, accessed on Oct. 17, 2018, pp. 1-2. (Year: 2018).*

(Continued)

*Primary Examiner* — Christine T Mui
(74) *Attorney, Agent, or Firm* — Hamilton, DeSanctis & Cha

(57) ABSTRACT

Embodiments are related to systems and methods for fluidic assembly, and more particularly to systems and methods for increasing the efficiency of fluidic assembly.

25 Claims, 8 Drawing Sheets

(56) References Cited

U.S. PATENT DOCUMENTS

| | | |
|---|---|---|
| 8,426,227 B1 | 4/2013 | Bibl et al. |
| 8,516,683 B2 | 8/2013 | Credelle et al. |
| 8,552,436 B2 | 10/2013 | Bibl et al. |
| 8,629,465 B2 | 1/2014 | Yu et al. |
| 8,648,328 B2 | 2/2014 | Crowder et al. |
| 8,685,774 B2 | 4/2014 | Crowder et al. |
| 2003/0057444 A1 | 3/2003 | Niki et al. |
| 2005/0009303 A1 | 1/2005 | Schatz |
| 2006/0057293 A1 | 3/2006 | Sharma et al. |
| 2006/0148166 A1 | 7/2006 | Craig et al. |
| 2006/0269689 A1 | 11/2006 | Craig et al. |
| 2007/0031992 A1 | 2/2007 | Schatz |
| 2007/0120463 A1 | 5/2007 | Hayashi et al. |
| 2007/0224713 A1 | 9/2007 | Han et al. |
| 2008/0036038 A1 | 2/2008 | Hersee et al. |
| 2010/0075463 A1 | 3/2010 | Smith et al. |
| 2010/0163895 A1 | 7/2010 | Horie |
| 2010/0276664 A1 | 11/2010 | Hersee |
| 2011/0031516 A1 | 2/2011 | Basin et al. |
| 2013/0161584 A1 | 6/2013 | Crowder et al. |
| 2013/0161643 A1 | 6/2013 | Crowder et al. |
| 2014/0008696 A1 | 1/2014 | Kim et al. |
| 2014/0077158 A1 | 3/2014 | Crowder et al. |
| 2014/0355931 A1 | 12/2014 | Tummala et al. |
| 2015/0060402 A1 | 3/2015 | Burkett et al. |
| 2015/0140721 A1 | 5/2015 | Moslehi et al. |
| 2015/0155445 A1 | 6/2015 | Zhan et al. |
| 2015/0166396 A1 | 6/2015 | Marjanovic et al. |
| 2015/0214430 A1 | 7/2015 | Zhan et al. |

OTHER PUBLICATIONS

Morris et al "Self-assembly for microscale and nanoscale packaging: steps toward self-packaging", IEEE Trans. Adv. Packag., 2005, 28, 600-611.

Boncheva "Millimeter-scale self-assembly and its applications", Pure Appl. Chem., 75, No. 5, pp. 621-630, 2003.

Mastrangeli et al "Self-assembly from milli- to nanoscales methods and applications" J. Micromech. Microeng., 2009,19, 083001, (37 PP).

Yeh "Fluidic self-assembly for the integration of GaAs light-emitting diodes on Si substrates", IEEE Photonics Technol. Lett., 1994, 6, 706-708.

Tien "Microfabrication through electrostatic self-assembly", Langmuir, 1997, 13, 5349-5355.

Snyder et al "Fluidic self-assembly of semiconductor devices: a promising new method of mass-producing flexible circuitry", Jpn. J. Appl. Phys., 2002,41,4366-4369.

Chung,Programmable reconfigurable self-assembly: parallel heterogeneous integration of chip-scale components on planar and nonplanar surfaces, J. Microelectromech. Syst., 2006.

Stauth "Self-assembled single-crystal silicon circuits on plastic", Proc. Nati. Acad. Sci, U. S. A., 2006, 103, 13922-13927.

Saeedi et al "Self-assembled single-digit micro-display on plastic", Proc. of SPIE, 2008, 6885, 688509.

Park "Orientation-specific self-assembly at air-water interface using magnetic field", Transducers'11, Beijing, China, Jun. 5-9, 2011, 866-869.

Tkachenko "Evaluation of directed self-assembly process for LED assembly on flexible substrates", Electronic Components & Technology Conference (ECTC), 2013 IEEE 63rd.

Nakagawa "Controlled deposition of silicon nanowires on chemically patterned substrate by capillary force using a blade-coating method", J. Phys. Chem. C, 2008,112, 5390-5396.

Arase, "Interfacial-energy-controlled deposition technique of microstructures using blade-coating", J. Phys. Chem. B, 2009, 113, 15278-15283.

Nakagawa "Interfacial-force-controlled placing technique of microstructures of sub- to one hundred micrometer size using blade coating", Jpn. J. Appl. Phys., 2011, 50, 01BJ09.

Arase, "Fluidic self-assembly of microstructures using a blade-coating technique" Jpn J. Appl. Phys., 2012, 51, 036501.

Nordquist et al., "An Electro-Fluidic Assembly Technique for Integration of III-V Devices onto Silicon" IEEE International Symposium on Compound Semiconductors, Proc. 2000.

Khare et al "Via Hole Formation in Semi-Insulating InP Using Wet Photoelectrochemcal Etching" Indium Phosphide and Related Materials, 1993. Conference proceedings.

Brusberg et al, "Thin Glass Based Packaging Technologies for Optoelectronic Modules" Electronic Components and Technology Conference, 2009.

Kim et al Large Scale Self-assembly of crystalline semiconductor microsomponents onto plastic substrates via microfluidic traps 4th IEEE Conf. on Automation (2008).

Xiao et al "Fluidic assisted thin-film device heterogeneous integration: surface tension as driving force and magnetic as guiding force" Science Direct (2015).

Yeh et al, "New fabrication technique for the integration of large area optoelectronic display panels" OSA/CLEO (1994).

Varna et al "Fluidic self-assembly of silicon microstructures" University of CA Berkley (1995).

Talghader Integration of LEDs and VCSELs using fluidic self-assembly (SPIE vol. 3286, p. 86), Dec. 1998.

Zheng et al, "Self-assembly process to integrate and connect semiconductor dies on surfaces with single-angular orientation and contact pad registration" Adv. Mater. (2006,18).

Park et al "A. First Implementation of an Automated Reel-to-Reel Fluidic Self-Assembly Machine" Adv. Mater. vol. 26, No. 34, Sep. 2014 Available online Jun. 2014.

Park et. al "Printed Assemblies of inorganic Light-Emitting Diodes for Deformable and Semitransparent Displays" Aug. 2009 www.Sciencemag.org.

Jacobs et al "Fabrication of a Cylindrical Display by Patterned Assembly" Science, vol. 296, Apr. 2002.

Chung et al "Guided and Fluidic Self-Assembly of Microstructures Using Railed Micrdfluidic channels" Pub. online Jun. 15, 2008.

\* cited by examiner

FLUIDIC ASSEMBLY USING TUNABLE SUSPENSION FLOW

FIELD OF THE INVENTION

Embodiments are related to systems and methods for fluidic assembly, and more particularly to systems and methods for increasing the efficiency of fluidic assembly.

BACKGROUND

As some examples, LED displays, LED display components, and arrayed LED devices include a large number of diodes formed or placed at defined locations across the surface of the display or device. Forming or placing such a large number of diodes often results in low throughput of assembled products. Such low throughput increases the cost of an end product.

Hence, for at least the aforementioned reasons, there exists a need in the art for advanced systems and methods for manufacturing LED displays, LED display components, and LED devices.

SUMMARY

Embodiments are related to systems and methods for fluidic assembly, and more particularly to systems and methods for increasing the efficiency of fluidic assembly.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. For example, reference numbers 130*a*, 130*b*, 130*c*, 130*d*, 130*e*, 130*f*, 130*g*, 130*h*, 120*a*, 142*a*, 142*b*, 142*c*, 142*d*, 142*e*, 142*f*, 342*a*, 342*b*, 342*c*, 342*d*, 342*e*, 342*f*, 342*g*, 342*h*, 342*i*, 342*j*, 342*k*, 342*l*, 342*m*, 342*n*, 342*o*, 342*p*, 342*q*, 342*r*, 342*s*, 342*t*, 342*u*, 342*v*, 342*w*, 342*x*, 342*y*, 341*a*, 341*b*, 341*c*, 341*d*, 341*e*, 341*f*, 341*g*, 341*h*, 343*a*, 343*b*, 343*c*, 343*d*, 442*a*, 442*b*, 442*c*, 442*d*, 442*e*, 442*f*, 442*g*, 442*h*, 442*i*, 442*j*, 442*k*, 442*l*, 442*m*, 442*n*, 442*o*, 442*p*, 442*q*, 442*r*, 442*s*, 442*t*, 442*u*, 442*v*, 442*w*, 442*x*, 442*y*, 443*a*, 443*b*, 443*c*, 443*d*, 475*a*, 475*b*, 475*c*, 475*d*, 475*e*, 410*a*, 410*b*, 410*c*, 410*d*, 410*e*, 410*f*, 410*g*, 410*h*, 570*a*, 570*b*, 570*c*, 542*a*, 542*b*, 542*c*, 542*d*, 542*e*, 542*f*, 542*g*, 542*h*, 542*i*, 542*j*, 542*k*, 542*l*, 542*m*, 542*n*, 542*o*, 542*p*, 542*q*, 542*r*, 542*s*, 542*t*, 542*u*, 542*v*, 542*w*, 542*x*, 542*y*, 510*a*, 510*b*, 510*c*, 510*d*, 510*e*, 510*f*, 510*g*, 510*h*, 543*a*, 543*b*, 543*c*, 543*d*, 670*a*, 670*b*, 670*c*, 642*a*, 642*b*, 642*c*, 642*d*, 642*e*, 642*f*, 642*g*, 642*h*, 642*i*, 642*j*, 642*k*, 642*l*, 642*m*, 642*n*, 642*o*, 642*p*, 642*q*, 642*r*, 642*s*, 642*t*, 642*u*, 642*v*, 642*w*, 642*x*, 642*y*, 610*a*, 610*b*, 610*c*, 610*d*, 610*e*, 610*f*, 610*g*, 610*h*, 643*a*, 643*b*, 643*c*, 643*d*, 862*a*, 862*b*, 862*c*, 862*d*, 862*e*, 862*f*, 862*g*, 862*h*, 862*i*, 862*j*, 866*a*, 866*b*, 866*c*, 866*d*, 866*e*, 866*f*, 866*g*, 866*h*, 866*i*, and 866*j*. When reference is made to a reference numeral without specification to an existing sub-label, it is intended to refer to all such multiple similar components.

DETAILED DESCRIPTION OF SOME EMBODIMENTS

Figure 1A:
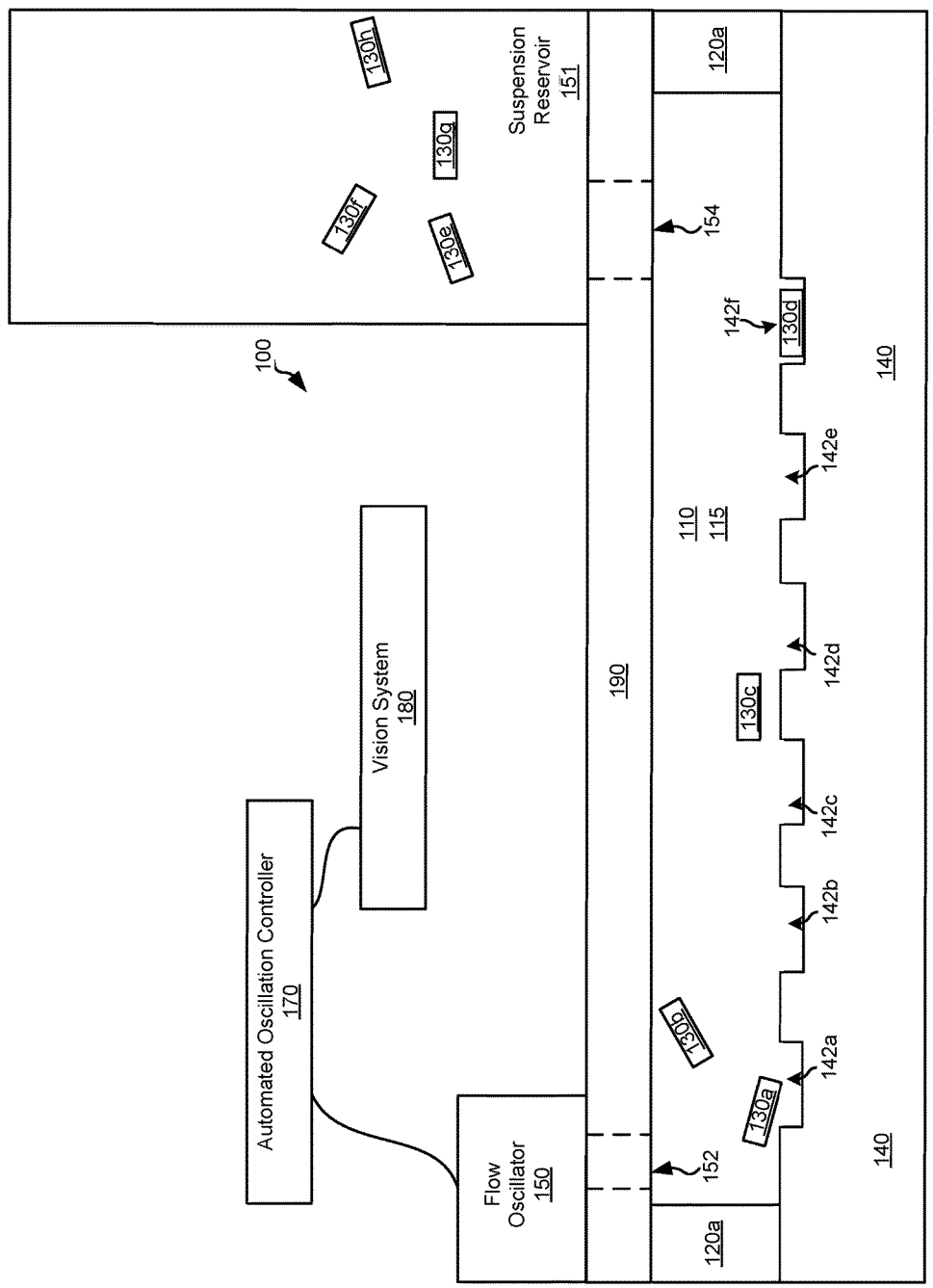
FIG. 1*a* depicts a fluidic assembly system capable of moving a suspension composed of a carrier liquid and a plurality of micro-components relative to the surface of a substrate in accordance with one or more embodiments of the present inventions.

Embodiments are related to systems and methods for fluidic assembly, and more particularly to systems and methods for increasing the efficiency of fluidic assembly.

Various embodiments provide fluidic assembly systems that include a fluidic flow chamber and a flow oscillator. The fluidic flow chamber is formed over a substrate including a plurality of wells and includes a top plate and side walls. The flow oscillator is operable to move a suspension within the fluidic flow chamber in at least a first direction and a second direction. In particular cases, the flow oscillator provides two separately controllable flow controls. The first flow control is the direction of flow (i.e., the first direction or the second direction), and the second flow control is the magnitude of fluid velocity of the suspension in the selected direction within the fluidic flow chamber. The suspension includes a plurality of micro-components and a carrier liquid. In some instances of the aforementioned embodiments, the first direction is away from the flow oscillator and the second direction is toward the flow oscillator. In one or more instances of the aforementioned embodiments, the micro-components are light emitting diodes. In some cases, the flow oscillator is a pump that can generate tunable fluidic flow. As used herein, the phrase "tunable fluidic flow" is used in its broadest sense to mean a flow of fluid that is selectable in either or both of a flow direction and a magnitude of the fluid flow.

In various instances of the aforementioned embodiments, the top plate is at least partially transparent and the system further includes a vision system. The vision system is operable to capture images of the location of micro-components relative to the plurality of wells through the top plate. In some cases, such systems further include an automated oscillation controller operable to: receive the images from the vision system; select a desired direction of flow of the suspension within the fluidic flow chamber and/or a magnitude of fluid velocity within the fluidic flow chamber based at least in part on the images; and command the flow oscillator to produce the selected direction of flow of the suspension and/or the selected magnitude of fluid velocity within the fluidic flow chamber. In particular cases, the vision system includes a microprocessor and a non-transient storage medium that stores instructions executable by the microprocessor to: receive the images from the vision system; select a desired direction of flow of the suspension within the fluidic flow chamber and a magnitude of fluid velocity within the fluidic flow chamber based at least in part on the images; and command the flow oscillator to produce the selected direction of flow of the suspension within the fluidic flow chamber and/or the selected magnitude of fluid velocity within the fluidic flow chamber.

In some instances of the aforementioned embodiments, the system further includes a suspension reservoir operable to hold a portion of the suspension outside of the fluidic flow chamber. In one or more instances of the aforementioned embodiments, the substrate further includes one or more control channels extending a first distance below a top surface of the substrate. At least a subset of the plurality of wells are within one of the one or more control channels and extend as second distance below the top surface of the substrate. In some cases, the control channels are substantially parallel to the first direction and the second direction. In particular instances of the aforementioned embodiments, the top plate includes at least one deflection bar extending down toward the substrate that is substantially perpendicular to the first direction and the second direction.

In various instances of the aforementioned embodiments where the flow oscillator is a first flow oscillator, the system further includes a second flow oscillator operable to move a suspension within the fluidic flow chamber in at least the first direction and the second direction. In other various instances of the aforementioned embodiments where the flow oscillator is a first flow oscillator, the system further includes a second flow oscillator operable to move a suspension within the fluidic flow chamber in at least a third direction and a fourth second direction. The third direction is away from the second flow oscillator and the fourth direction is toward the second flow oscillator, and the third direction and the fourth direction are substantially perpendicular to the first direction and the second direction.

Other embodiments provide methods for fluidic assembly that include: providing a fluidic flow chamber including a top plate, a substrate including a plurality of wells, and side walls; introducing a suspension into the fluidic flow chamber, where the suspension includes a plurality of micro-components and a carrier fluid; commanding a flow oscillator to force movement of the suspension within the fluidic flow chamber alternately in a first direction and a second direction; capturing an image of a location of micro-components relative to the plurality of wells through the top plate; based at least in part on the image, selecting both a magnitude of fluid flow and one of the first direction or the second direction as a tunable fluidic flow; and commanding the flow oscillator to force movement of the suspension within the fluidic flow chamber in accordance with the tunable fluidic flow.

In some instances of the aforementioned embodiments, the flow oscillator is a pump configured to provide a range of tunable fluidic flow. In some cases, the first direction is away from the pump and the second direction is toward the pump. In various instances of the aforementioned embodiments, the micro-components are light emitting diodes. In one or more instances of the aforementioned embodiments, the substrate further includes one or more control channels along a top surface of the substrate. In some cases, the control channels are substantially parallel to the first direction and the second direction. In various cases, the control channels are substantially perpendicular to the first direction and the second direction. In some instances of the aforementioned embodiments, the top plate includes at least one deflection bar extending down toward the substrate that is substantially perpendicular to the first direction and the second direction.

Yet other embodiments provide fluidic assembly systems that include: a fluidic flow chamber, a flow oscillator, a suspension reservoir, a vision system, and an automated oscillation controller. The fluidic flow chamber is formed by a substrate, a top plate, and side walls. The substrate includes a plurality of wells extending below a top surface of the substrate. The flow oscillator is fluidically coupled to the fluidic flow chamber and configured to: pump a suspension within the fluidic flow chamber in a first direction at a first selectable magnitude of fluidic flow toward the flow oscillator, and pump the suspension within the fluidic flow chamber in a second direction at as second selectable magnitude of fluidic flow away from the flow oscillator. The suspension includes a plurality of micro-components and a carrier liquid. The suspension reservoir is fluidically coupled to the fluidic flow chamber and configured to hold a portion of the suspension outside of the fluidic flow chamber. The vision system is configured to capture images of the location of micro-components relative to the plurality of wells through the top plate. The automated oscillation controller configured to: receive the images from the vision system; select one of the first direction and the second direction as a selected direction of flow of the suspension within the fluidic flow chamber based at least in part on the images; select a magnitude of fluidic flow within the fluidic flow chamber as a selected magnitude of fluidic flow based at least in part on the images; and command the flow oscillator to produce the selected direction and the selected magnitude of fluidic flow of the suspension within the fluidic flow chamber.

Turning to FIG. 1a, a fluidic assembly system 100 capable of moving a suspension 110 composed of a carrier liquid 115 and a plurality of micro-components 130 relative to the surface of a substrate 140 is shown in accordance with one or more embodiments of the present inventions. In some embodiments, substrate 140 is formed of a polymer material laminated to the surface of a glass substrate. In particular embodiments, wells 142 are etched or otherwise formed in the laminate layer. As used herein, the term "well" is used in its broadest sense to mean any surface feature into which only a single micro-component may be deposited. In other embodiments, the substrate is made of glass with wells 142 directly formed into the glass. Wells 142 may have flat and vertical surfaces as shown, or they may have bottoms and sides with complex curvatures. As more fully discussed below, wells 142 may be formed within control channels (not shown) that are etched into (or patterned on top of) the surface of substrate 140. In some embodiments the number of micro-components 130 is substantially larger than the number of wells 142. As an example, in one embodiment, the number of micro-components 130 is more than ten times greater than the number of wells 142. Based upon the disclosure provided herein, one of ordinary skill in the art will recognize a variety of materials, processes, and/or structures that may be used to form substrate 140. For example, substrate 140 can be formed of any material or composition compatible with fluidic device processing. This can include, but is not limited to, glass, glass ceramic, ceramic, polymer, metal, or other organic or inorganic materials. As examples, wells 142 can be defined in a single material forming a surface feature layer when applied to the surface of a base glass sheet. It is also possible for patterned conductor layers to exist between wells 142 formed in such a surface feature layer and the base glass layer. Substrate 140 can also be made of multiple layers or combinations of these materials. Substrate 140 may be a flat, curved, rigid, or flexible structure. In some cases, substrate 140 may end up being the final device substrate or it may only serve as an assembly substrate to position micro-components 130. In the case of an assembly substrate, micro-components 130 would then be transferred to the final device substrate in subsequent steps. As an example, wells 142 may be sixty (60) microns (i.e., $10^{-6}$ meters) in diameter with a depth of five (5) microns, and micro-components may be fifty (50) microns with a height of five (5) microns. Based upon the disclosure provided herein, one of ordinary skill in the art will recognize various sizes of wells 142 and micro-components 130 that may be used in relation to different embodiments of the present inventions.

In some embodiments, carrier liquid 115 is isopropanol. In some cases, a surfactant such as Triton X-100™ may be added to reduce stiction forces between individual micro-components 130 and/or between micro-components 130 and surfaces within a fluidic flow chamber. Based upon the disclosure provided herein, one of ordinary skill in the art will recognize a variety of liquids, gasses, and/or liquid and gas combinations that may be used as the carrier liquid. It should be noted that various analysis provided herein is based upon flow in a single, continuous direction or in other cases a relatively simple back-forth motion, but that the flow may be more complex where both the direction and magnitude of fluid velocity can vary over time.

As shown in FIG. 1, micro-components 130 are of a size and shape capable of fitting into a well 142. As used herein, the phrase "micro-component" is used broadly to mean any device capable of dispersement within a carrier liquid to make a suspension. In particular embodiments, micro-components 130 are light emitting diode (LED) devices. In some cases, the depth of wells 142 is substantially equal to the height of the micro-components 130 and the inlet opening of wells 142 is greater that the width of the micro-components 130 such that only one micro-component 130 deposits into any given well 142. A fluidic flow chamber of fluidic assembly system 100 is defined by substrate 140, side gaskets 120, and a transparent plate 190. Side gaskets 120 may be formed of any elastomeric material capable of forming a liquid seal between transparent plate 190 and substrate 140 such that carrier liquid 115 does not drain on the edges defined by side gaskets 120. In one particular embodiment, side gaskets 120 are formed of polydimethylsiloxane (PDMS). Based upon the disclosure provided herein, one of ordinary skill in the art will recognize a variety of materials that may be used to form side gaskets 120 in accordance with different embodiments of the present invention. In some embodiments, the height of a fluidic flow chamber between a top surface of substrate 140 and a bottom surface of transparent plate 190 is defined by the height of side gaskets 120 and is between fifty (50 microns and one (1) millimeter.

Transparent plate 190 may be formed of any material that both allows for a vision system 180 to make images of micro-components 130 in relation to substrate 140 and does not allow carrier liquid 115 to leak out of the fluidic flow chamber. In some embodiments, transparent plate 190 is made of glass. In other embodiments, transparent plate 190 is made of plastic. Based upon the disclosure provided herein, one of ordinary skill in the art will recognize a variety of materials out of which transparent plate 190 may be formed.

A suspension reservoir 151 is fluidically coupled to the fluidic flow chamber by an opening 154. Suspension reservoir 151 may be any apparatus capable of holding a volume of suspension 110. Opening 154 is sufficiently large to allow micro-components 130 to move freely between suspension reservoir 151 and the fluidic flow chamber. In some embodiments, suspension reservoir 151 sits off to the side of transparent plate 190 and is connected by a fluid tube (not shown) connecting suspension reservoir 151 to the fluidic flow chamber via opening 154. In some such embodiments, the fluid tube is connected to opening 154 using a block of PDMS.

A flow oscillator 150 is fluidically coupled to the fluidic flow chamber by an opening 152. Opening 152 may be sufficiently large to allow micro-components 130 to move freely between flow oscillator 150 and the fluidic flow chamber. Flow oscillator 150 is a reversible pump that operates to: pull suspension 110 from the fluidic flow chamber causing additional suspension 110 to move from suspension reservoir 151 into the fluidic flow chamber, and push suspension 110 into the fluidic flow chamber causing suspension 110 to move from the fluidic flow chamber into suspension reservoir 151. The push and pull direction of flow oscillator 150 is controlled by an automated oscillation controller 170. Based upon the disclosure provided herein, one of ordinary skill in the art will recognize a variety of devices that may be used to create the push and pull flow provided by flow oscillator 150. For example, flow oscillator 150 may be implemented by a simple manual syringe or by an automated peristaltic pump. In some embodiments, flow oscillator 150 sits off to the side of transparent plate 190 and is connected by a fluid tube (not shown) connecting flow oscillator 150 to the fluidic flow chamber via opening 152. In some such embodiments, the fluid tube is connected to opening 154 using a block of PDMS. As an example, flow oscillator 150 may be tunable to produce a magnitude of fluidic flow of between one hundred (100) and two thousand, two hundred (2200) micro liters per minute (i.e., 10-6 liters per minute). Based upon the disclosure provided herein, one of ordinary skill in the art will recognize various flow rates that may be produced in suspension 110 for use in relation to different embodiments of the present inventions.

Vision system 180 includes an imaging microscope that is capable of producing images of substrate 140 through transparent plate 190. The produced images may be translated into an X-Y plane representing the surface of substrate 140, and provide sufficient resolution to determine that a particular well 142 is either filled or not filled by a micro-component 130, and to show loose micro-components 130 outside of wells 142. Based upon the disclosure provided herein, one of ordinary skill in the art will recognize a variety of imaging systems that may be used in relation to different embodiments. Vision system 180 provides a continuous stream of images to automated oscillation controller 170 that in turn modifies the flow of suspension 110 by controlling flow oscillator 150. Automated oscillation controller 170 may be any circuit or device capable of receiving image data, selecting a desired flow direction and/or magnitude of fluidic flow based upon the received image data, and providing a control corresponding to the selected flow direction and/or magnitude of fluidic flow to flow oscillator 150. In some embodiments, automated oscillation controller 170 is a computer executing control instructions. Based upon the disclosure provided herein, one of ordinary skill in the art will recognize a variety of apparatus that may be used to implement automated oscillation controller 170.

Figure 1B:
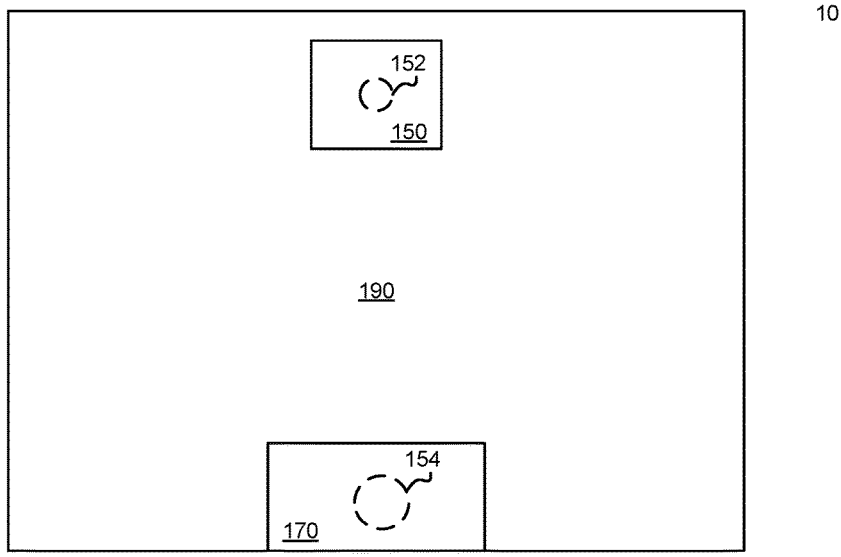
FIG. 1*b* shows a top view of the fluidic assembly system of FIG. 1*a* with focus on a transparent plate, flow oscillator, and suspension reservoir.
Figure 1C:
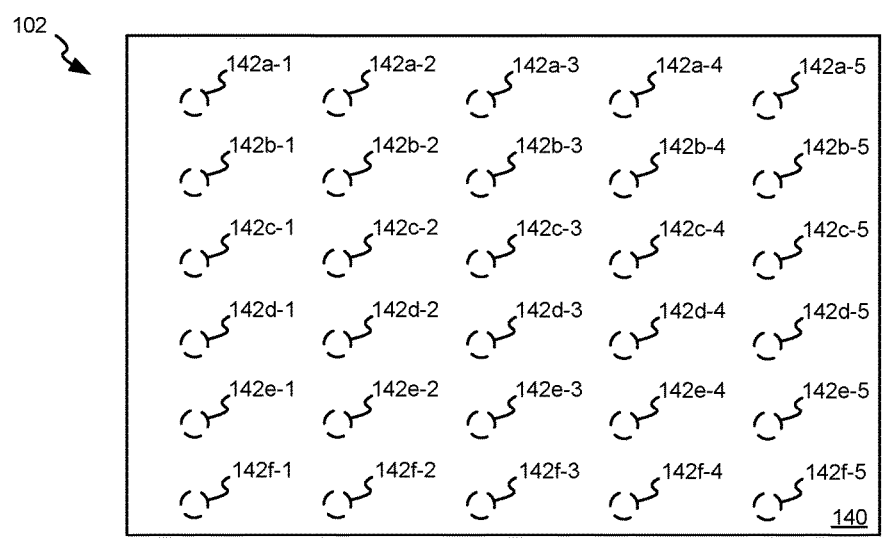
FIG. 1*c* shows a top view of a substrate of the fluidic assembly system of FIG. 1*a*.

Turning to FIG. 1b, a top view 101 of fluidic assembly system 100 is shown with a focus on a transparent plate 190, flow oscillator 150, and suspension reservoir 151. Turning to FIG. 1c, a top view 102 of substrate 140 is shown with each of wells 142 shows as dashed lines.

After assembly of fluidic assembly system 100, flow oscillator 150 is started under the direction of automated oscillation controller 170 to implement a default program of push and pull actions causing a multi-directional flow of the micro-component suspension 110 over substrate 140 within the fluidic flow chamber. This default program of push and pull actions applied by flow oscillator 150 causes what appears to be a stochastic movement of micro-components 130 relative to wells 142 in the substrate with some of the wells 142 being filled by individual micro-components 130. Once deposited within a well, the flow of suspension 110 within the fluidic flow chamber is designed to be low enough to not result in dislodging the already deposited micro-component 130.

As micro-components 130 are being distributed in the default multi-directional flow of suspension 110 within the fluidic flow chamber, images of micro-components 130 relative to wells 142 in substrate 140 are captured by vision system 180. These images are transferred to automated oscillation controller 170 which decides whether one or more wells 142 are likely to be filled by a micro-component 130 if a particular flow direction and/or magnitude of fluid velocity is chosen. Where it is determined that one or more micro-components 130 are located relative to a given well 142 such that one of the two flow directions and/or a particular magnitude of fluid velocity is better than the other, the direction and/or magnitude of fluid velocity produced by flow oscillator 150 is changed to the identified tunable fluidic flow by a command from automated oscillation controller 170. By modifying the tunable fluidic flow of the suspension, the direction and/or velocity of a subset of the micro-components 130 is controlled. This control generally increases the rate at which fluidic assembly of micro-components 130 into wells 142 of substrate 140 is achieved when compared with application of a random flow. The increase in rate is achieved through reducing the randomness of movement of micro-components 130 relative wells 142 by controlling flow directions and/or magnitudes of fluidic velocity.

Figure 3A:
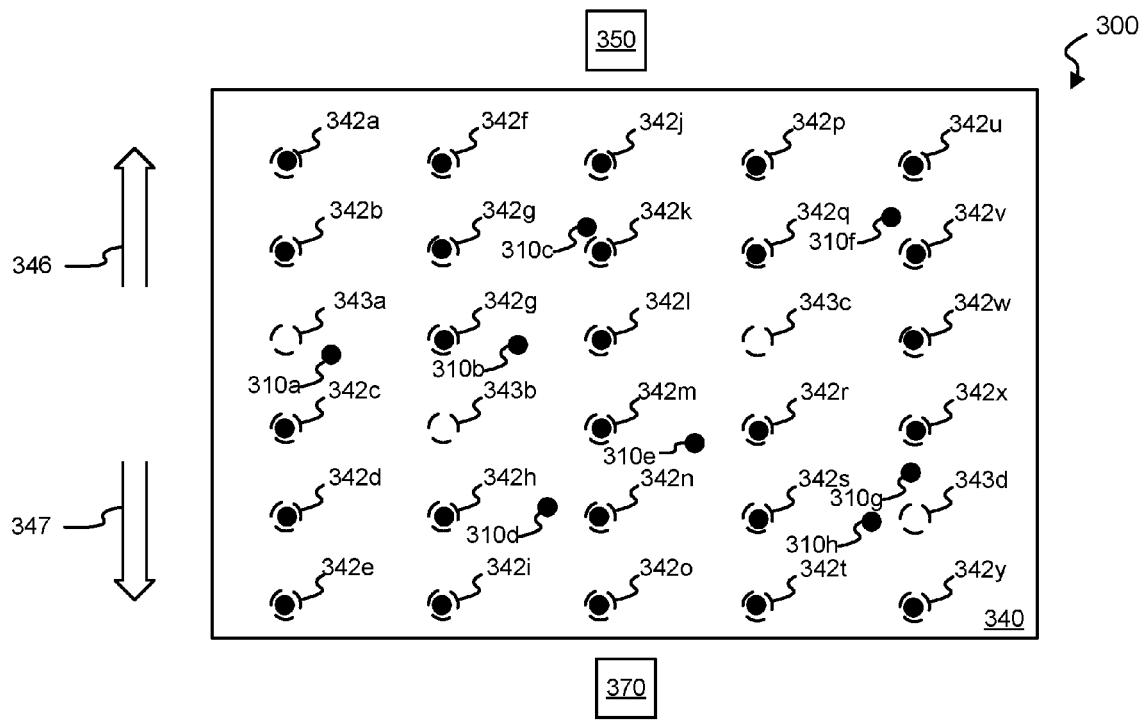
FIGS. 3*a*-3*b* show a top view of a substrate over which micro-components are moving and in some cases deposited within wells of the substrate.

Turning to FIG. 3a, a top view 300 shows a substrate 340 over which micro-components are moving and in some cases deposited within wells of the substrate. In this example, a number of wells are already filled with micro-components and are indicated as filled wells 342. Other wells are not yet filled and are indicated as empty wells 343. A number of micro-components are moving over substrate 340 and are indicated as free micro-components 310. A suspension reservoir 370 is installed near substrate 340, and a flow oscillator 350 alternatively applies a push force causing a flow of the suspension including free micro-components 310 generally in a direction 347, and a pull force causing a flow of the suspension including free micro-components 310 generally in a direction 346. As shown, a push force may increase the likelihood that free micro-component 310g will deposit in empty well 343d, whereas a pull force is less likely to result in a deposition of a free micro-component 310 into an empty well 343. In such a case, the automated oscillation controller sends a signal to flow oscillator 350 to implement a push force (or to continue with a push force). This command remains until either free micro-component 310g will deposit in empty well 343d, or another force direction by flow oscillator 350 would result in a greater possibility of deposition of a free micro-component 310 into an empty well 343.

Figure 2:
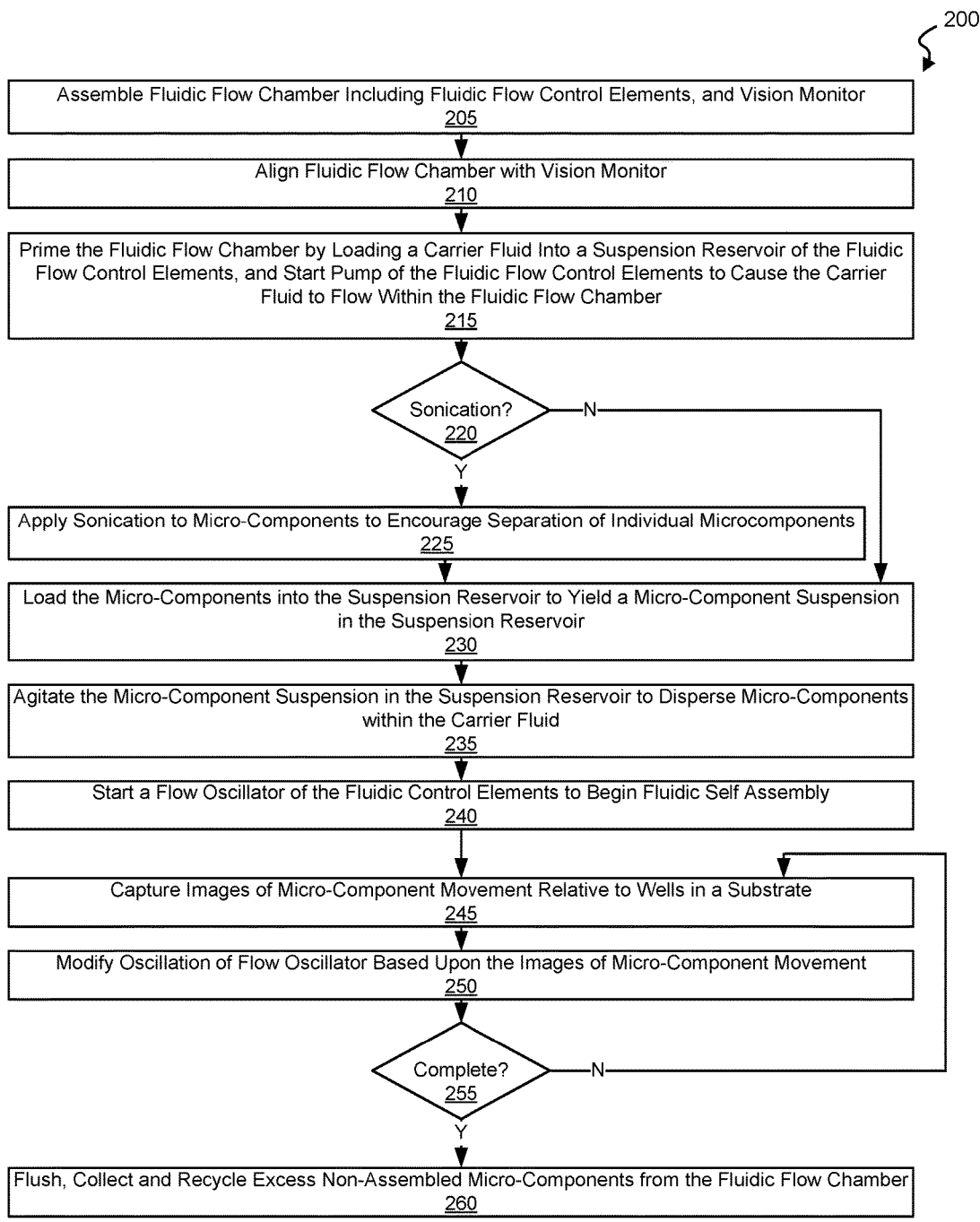
FIG. 2 is a flow diagram showing a method in accordance with some embodiments of the present inventions for fluidic assembly using tunable fluidic flow.

Turning to FIG. 2, a flow diagram 200 shows a method in accordance with some embodiments of the present inventions for fluidic assembly using tunable fluidic flow. Following flow diagram 200, a fluidic flow chamber including various fluidic control elements is assembled in relation to a vision monitor (block 205). The fluidic control elements include, but are not limited to, a flow oscillator, a suspension reservoir, a substrate, side gaskets, and a transparent plate. Side gaskets are installed on top of the substrate to form walls of the fluidic flow chamber, and the transparent top plate is installed on the walls formed by the side gaskets. This assembly defines the fluidic flow chamber. Next, the flow oscillator is fluidically coupled to the fluidic flow chamber via an opening in the transparent top plate, and the suspension reservoir is fluidically coupled to the fluidic flow chamber via another opening in the transparent top plate. The vision monitor is installed relative to the transparent top plate such that it can capture images of the substrate and micro-components through the transparent top plate. The vision monitor is electrically connected to an automated oscillation controller which itself is electrically connected to the flow oscillator.

The vision monitor is installed relative to the transparent top plate such that it can capture images of the substrate and micro-components through the transparent top plate (block 210). The fluidic flow chamber is primed by loading carrier liquid into the suspension reservoir (block 215). This carrier liquid flows from the suspension reservoir into the fluidic flow chamber and into the flow oscillator. The flow oscillator can then begin the process of pulling a portion of the carrier liquid from the fluidic flow chamber and reversing to push a portion of the carrier liquid back into the fluidic flow chamber to produce a multi-directional flow within the fluidic flow chamber.

It is then determined whether a grouping of micro-components is to be exposed to sonication (block 220). Such sonication involves exposing the grouping of micro-components to sonic energy to cause individual micro-components to separate from one another. Where sonication is desired (block 220), the grouping of micro-components is exposed to sound energy (block 225). In either case, the grouping of micro-components is loaded into the carrier liquid already in the suspension reservoir to yield a micro-component suspension in the suspension reservoir (block 230). The micro-component suspension in the suspension reservoir is agitated to disperse the micro-components within the carrier liquid (block 235).

Flow oscillator is started using a default program of push and pull actions causing a multi-directional flow of the micro-component suspension over the substrate within the fluidic flow chamber (block 240). This default program of push and pull actions applied by the flow oscillator cause what appears to be a stochastic movement of the micro-components relative to the wells in the substrate with some wells being filled by individual micro-components. Once deposited within a well, the flow of the suspension within the fluidic flow chamber is designed to be low enough to not result in dislodging the already deposited micro-component.

As the micro-components are being distributed in the default multi-directional flow of the suspension within the fluidic flow chamber, images of the micro-components relative to wells in the substrate are captured (block 245). These images are transferred to the automated oscillation controller which decides whether one or more wells are likely to be filled by a micro-component if a particular flow direction and/or magnitude of fluid velocity is chosen. Where it is determined that one or more micro-components are located relative to a given well such that one of the two flow directions and/or a particular magnitude of fluid velocity is better than the other, the direction and/or magnitude of fluid velocity produced by the flow oscillator is changed to the identified tunable fluidic flow (block 250). By modifying the tunable fluidic flow of the suspension, the direction and/or velocity of a subset of the micro-components is controlled. This control generally increases the rate at which fluidic assembly of the micro-components into the wells of the substrate is achieved when compared with application of a random flow. Further, where one or more micro-components are located very near an unfilled well, the magnitude of the fluid flow in the selected direction may be modified to ease the one or more micro-components toward the respective wells. In some cases, modifying oscillation of the flow oscillator based upon the images of micro-component movement may be limited to modifying a direction of flow generated by the flow oscillator. In other cases, modifying oscillation of the flow oscillator based upon the images of micro-component movement may be limited to modifying a magnitude of the fluid flow generated by the flow oscillator. In yet other cases, modifying oscillation of the flow oscillator based upon the images of micro-component movement includes both changing a direction of flow generated by the flow oscillator and changing a magnitude of the fluid flow generated by the flow oscillator in the selected direction.

Turning to FIG. 3a, top view 300 shows substrate 340 over which micro-components are moving and in some cases deposited within wells of the substrate. In this example, a number of wells are already filled with micro-components and are indicated as filled wells 342. Other wells are not yet filled and are indicated as empty wells 343. A number of micro-components are moving over substrate 340 and are indicated as free micro-components 310. A suspension reservoir 370 is installed near substrate 340, and a flow oscillator 350 alternatively applies a push force causing a flow of the suspension including free micro-components 310 generally in a direction 347, and a pull force causing a flow of the suspension including free micro-components 310 generally in a direction 346. As shown, a push force may increase the likelihood that free micro-component 310g will deposit in empty well 343d, whereas a pull force is less likely to result in a deposition of a free micro-component 310 into an empty well 343. In such a case, the automated oscillation controller sends a signal to flow oscillator 350 to implement a push force (or to continue with a push force). This command remains until either free micro-component 310g will deposit in empty well 343d, or another force direction by flow oscillator 350 would result in a greater possibility of deposition of a free micro-component 310 into an empty well 343.

Figure 3B:
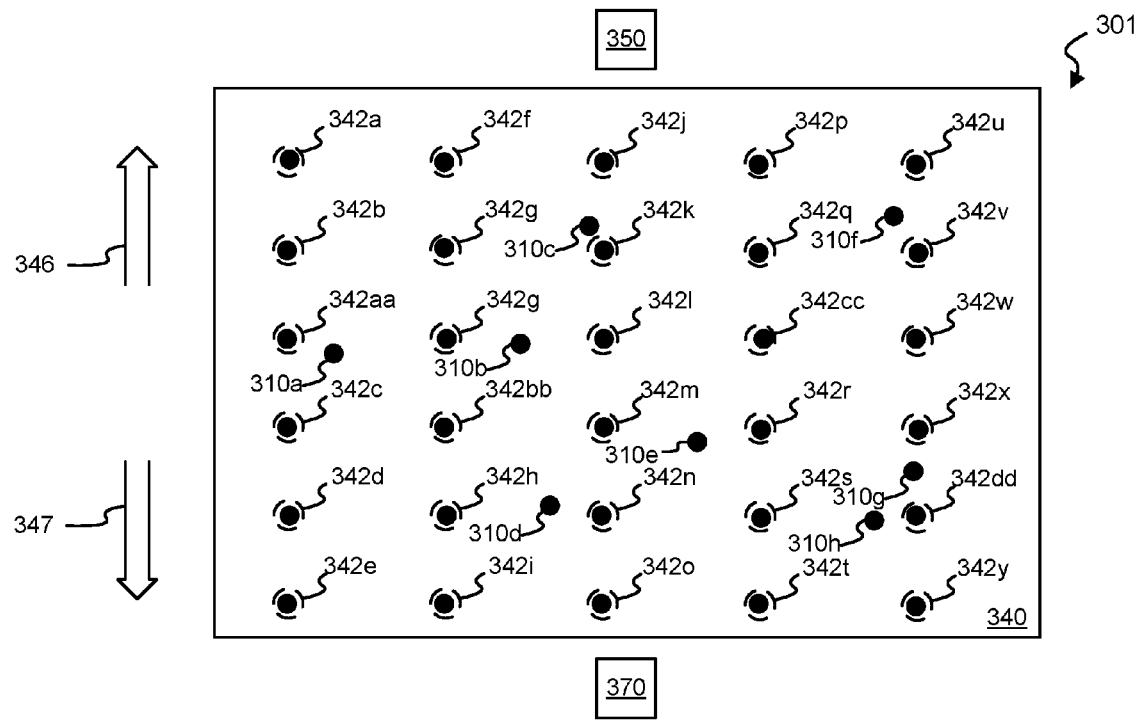

Returning to FIG. 2, it is determined whether all wells in the substrate have been filled with micro-components (block 255). Turning to FIG. 3b, a top view 301 shows an example of a completed self assembly where all wells in substrate 340 are filled and are indicated as filled wells 342. Additional free micro-components 310 remain. Returning again to FIG. 2, where all wells have been filed (block 255), self assembly process is completed by flushing excess suspension from the fluidic flow chamber using neat fluid and recycling excess micro-components included in the flushed suspension (block 260). Alternatively where all of the wells on the substrate have not yet been filled (block 255), the processes of blocks 245-255 are repeated.

Figure 4A:
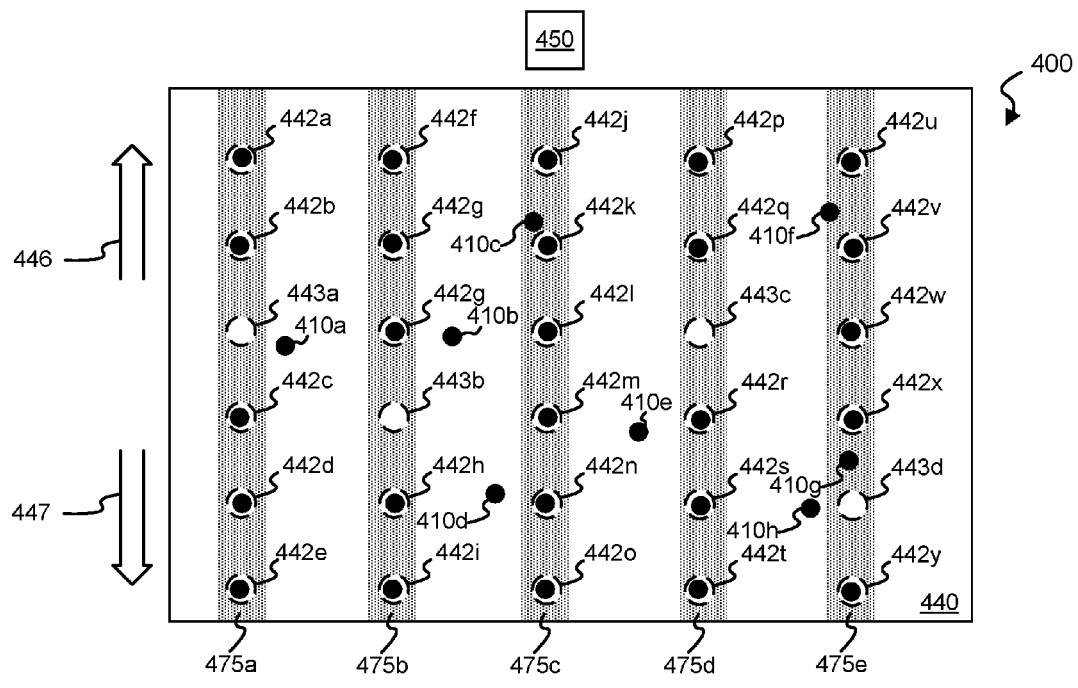
FIGS. 4*a*-4*d* show a top view of flow oscillators and suspension reservoirs used in relation to a substrate including control channels in accordance with various embodiments of the present inventions.

Turning to FIG. 4a, a top view 400 of a flow oscillator 450, a suspension reservoir 470, and a substrate 440 is shown. Substrate 440 may be used in place of substrate 140 discussed above in relation to FIG. 1a. Substrate 440 includes a number of control channels 475 formed within substrate 440 to guide free micro-components 410 toward empty wells 443. As shown, wells (shown as filled wells 442 and empty wells 443) are formed within channels 470 such that a free micro-component 410 that falls into a given control channel 475 will tend to move in either a push direction 447 or a pull direction 446 toward wells within the channel 475. Use of such control channels reduces the randomness of movement of free micro-components 410, and generally increases the rate at which fluidic assembly is completed.

Figure 4B:
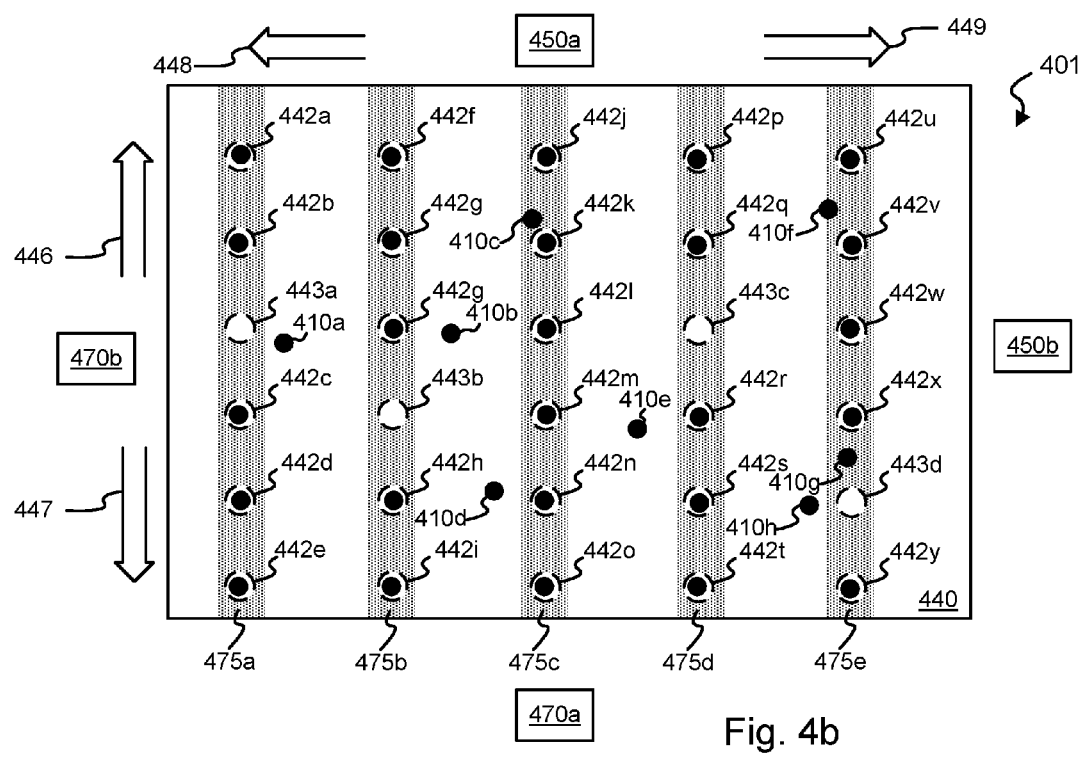

Turning to FIG. 4b, a top view 401 of flow oscillators 450a, 450b, and suspension reservoirs 470a, 470b are shown in relation to substrate 440. As shown, flow oscillator 450a alternatively applies a push force causing a flow of the suspension including free micro-components 410 generally in a direction 447, and a pull force causing a flow of the suspension including free micro-components 410 generally in a direction 446. Flow oscillator 450b alternatively applies a push force causing a flow of the suspension including free micro-components 410 generally in a direction 448, and a pull force causing a flow of the suspension including free micro-components 410 generally in a direction 449. In operation, flow oscillator 450b is first operated to create push and pull forces in directions 448, 449 which are generally perpendicular to control channels 475. These gentle push and pull forces increase the likelihood that free micro-components will deposit within one of control channels 475. Once the vision system detects free micro-components 410 within control channels 475, flow oscillator 450a is operated to create push and pull forces in directions 446, 447 which are generally parallel to control channels 475. These gentle push and pull forces increase the likelihood that free micro-components will move along control channels 475 and deposit within one of empty wells 443 located along control channels 475. The arrangement of substrate 440 and flow oscillators 450 may be used in place of substrate 140 and flow oscillator 150 discussed above in relation to FIG. 1a. Again, FIGS. 4c and 4d show an example channel depth relative to well depth in substrate 440.

Figure 4C:
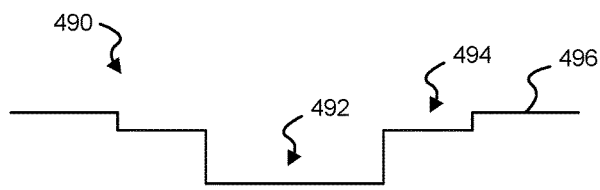
Figure 4D:
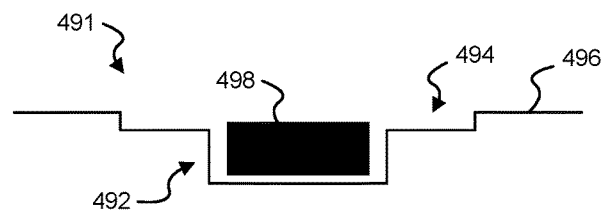

Turning to FIG. 4c, a cross sectional view 490 of an well 492 within a control channel 494 is shown. Of note, control channel 494 extends only slightly below an upper surface 496 of a substrate, while well 492 extends to a greater depth. In some cases, as depicted in FIG. 4d, the depth of well 492 is greater than the height of a micro-component 498 such that once micro-component 498 deposits within well 492 it is difficult to displace it from the well. In contrast, the depth of control channel 494 is substantially less than that of well 492, and is sufficiently deep that it is most likely for the micro-component to continue moving within control channel 475.

Figure 5:
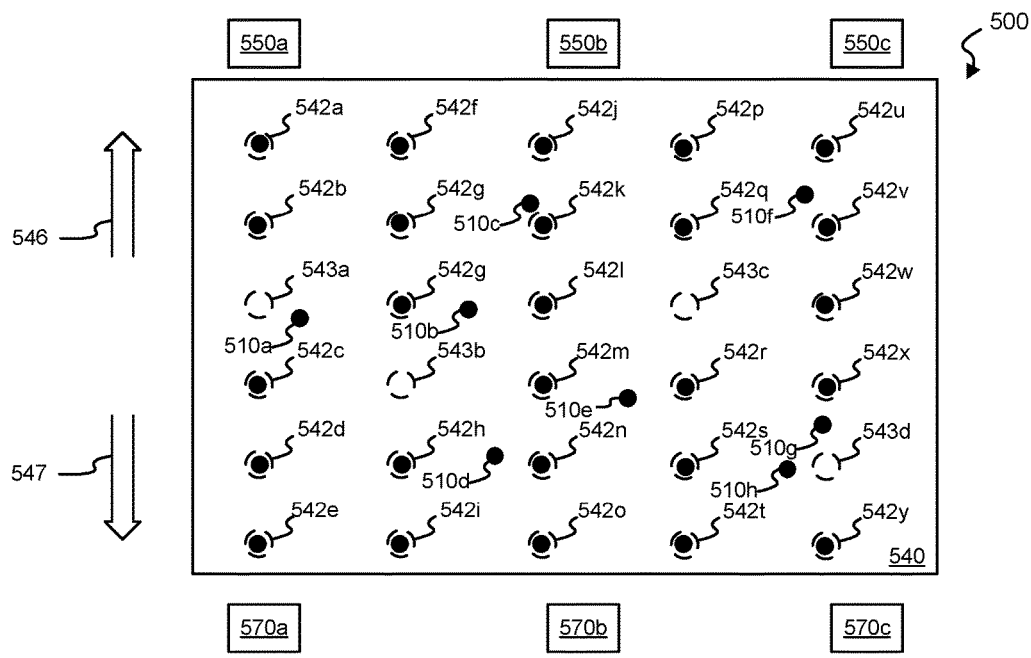
FIG. 5 shows a top view of multiple flow oscillators and suspension reservoirs disposed in relation to a single substrate in accordance with various embodiments of the present inventions.

Turning to FIG. 5, a top view 500 of multiple flow oscillators 550 and suspension reservoirs 570 disposed in relation to a single substrate 540 is shown. The arrangement of substrate 540 and flow oscillators 550 may be used in place of substrate 140 and flow oscillator 150 discussed above in relation to FIG. 1a. As shown, each of flow oscillators 550a, 550b, 550c alternatively applies a push force causing a flow of the suspension including free micro-components 510 generally in a direction 547, and a pull force causing a flow of the suspension including free micro-components 510 generally in a direction 546. By using multiple flow oscillators 550 aligned as shown in top view 500, a more uniform flow is possible across the entire surface of substrate 540 when compared with the flow generated using a single flow oscillator as discussed above in relation to FIGS. 3a-3b. Further, in some embodiments, each of flow oscillators 550a, 550b, 550c are independently controllable by an automated oscillation controller (e.g., automated oscillation controller 170 of FIG. 1). By allowing independent control of flow oscillators 550a, 550b, 550c, additional control of flows around selected free micro-components 510 may be generated. It should be noted that while the embodiment of FIG. 5 is shown using three flow oscillators 550 in parallel, that more or fewer than three flow oscillators may be used in relation to different embodiments. The number of flow oscillators 550 may be scaled as a function of the size of substrate 540 and the desired level of flow control. The desired level of flow control should avoid dead zones near relevant areas of substrate including wells. Further, the angle of inlets and outlets to/from flow oscillators 550 and suspension0 reservoirs 570 may be adjusted to in order to reduce or eliminate aggregations of micro-components during loading or active flow periods.

Figure 6:
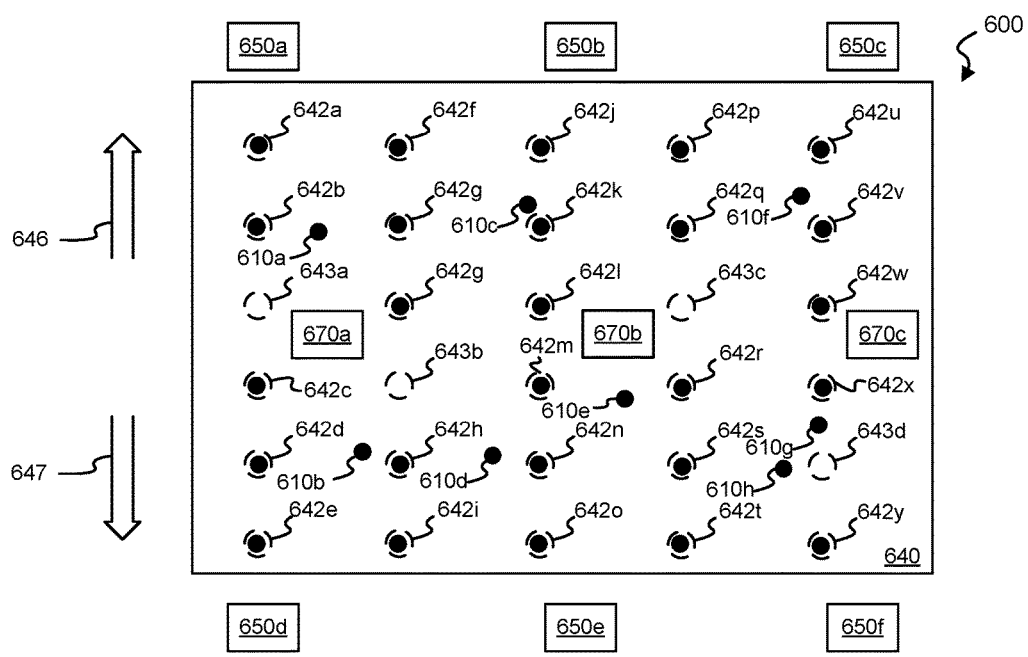
FIG. 6 shows a top view of multiple flow oscillators and suspension reservoirs disposed in relation to a single substrate in accordance with other embodiments of the present inventions.

Turning to FIG. 6, a top view 600 of multiple flow oscillators 650 surrounding a substrate 640 with multiple reservoirs 670 disposed over substrate 640 is shown. The arrangement of substrate 640, flow oscillators 650, and suspension reservoirs 670 may be used in place of substrate 140, flow oscillator 150, and suspension reservoir 151 discussed above in relation to FIG. 1a. As shown, each of flow oscillators 650a, 650b, 650c alternatively applies a push force causing a flow of the suspension including free micro-components 610 generally in a direction 647, and a pull force causing a flow of the suspension including free micro-components 610 generally in a direction 646; and each of flow oscillators 650d, 650e, 650f alternatively applies a push force causing a flow of the suspension including free micro-components 610 generally in a direction 646, and a pull force causing a flow of the suspension including free micro-components 610 generally in a direction 647. By using multiple flow oscillators 650 aligned as shown in top view 600, a more uniform flow is possible across the entire surface of substrate 640 when compared with the flow generated using a single flow oscillator as discussed above in relation to FIGS. 3a-3b, or the one sided distribution of flow oscillators discussed above in relation to FIG. 5. Further, in some embodiments, each of flow oscillators 650a, 650b, 650c, 650d, 650e, 650f are independently controllable by an automated oscillation controller (e.g., automated oscillation controller 170 of FIG. 1). By allowing independent control of flow oscillators 650a, 650b, 650c, 650d, 650e, 650f, additional control of flows around selected free micro-components 610 may be generated. It should be noted that while the embodiment of FIG. 6 is shown using six flow oscillators 650, that more or fewer than six flow oscillators may be used in relation to different embodiments. The number of flow oscillators 650 and suspension reservoirs 670 may be scaled as a function of the size of substrate 640 and the desired level of flow control. The desired level of flow control should avoid dead zones near relevant areas of substrate including wells. Further, the angle of inlets and outlets to/from flow oscillators 650 and suspension reservoirs 670 may be adjusted to in order to reduce or eliminate aggregations of micro-components during loading or active flow periods.

Figure 7A:
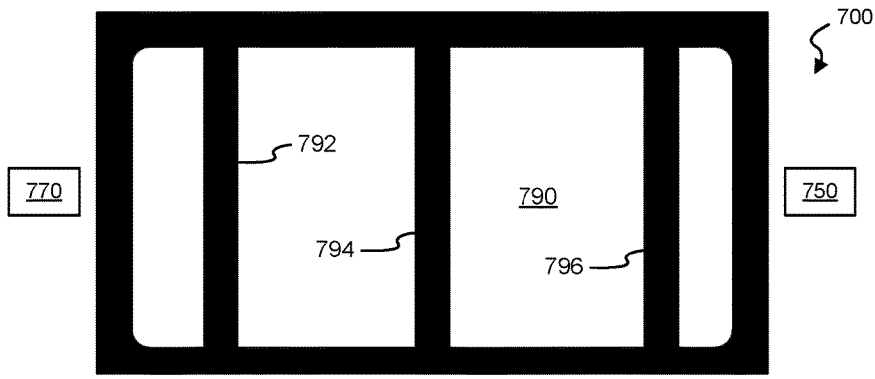
FIGS. 7*a*-7*b* depict a particular implementation of a transparent plate that may be used in relation to the fluidic assembly system of FIG. 1*a* in accordance with one or more embodiments of the present inventions.
Figure 7B:
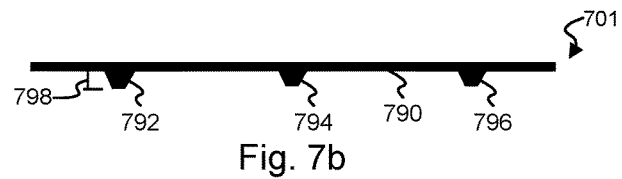

Turning to FIGS. 7a-7b, a particular implementation of a transparent plate 790 is depicted that may be used in place of transparent plate 190 discussed above in relation to FIG. 1a. FIGS. 7a-7b show a top view 700 and a cross sectional view 701 of transparent plate 790 including deflection bars 792, 794, 796 extending downward a distance 798 form a bottom surface of transparent plate 790. A flow oscillator 750 and a suspension reservoir 770 are shown in relation to transparent plate 790. As push and pull forces are applied by flow oscillator 750 one or more micro-components brush up against the bottom surface of transparent plate 790 as they are moved with the suspension. As the micro-components brush up against transparent plate 790 they are deflected downward by deflection bars 792, 794, 796 toward the surface of an underlying substrate. In some embodiments, distance 798 is between forty (40) microns and nine hundred fifty (950) microns. Based upon the disclosure provided herein, one of ordinary skill in the art will recognize a variety of lengths for distance 798.

Figure 8:
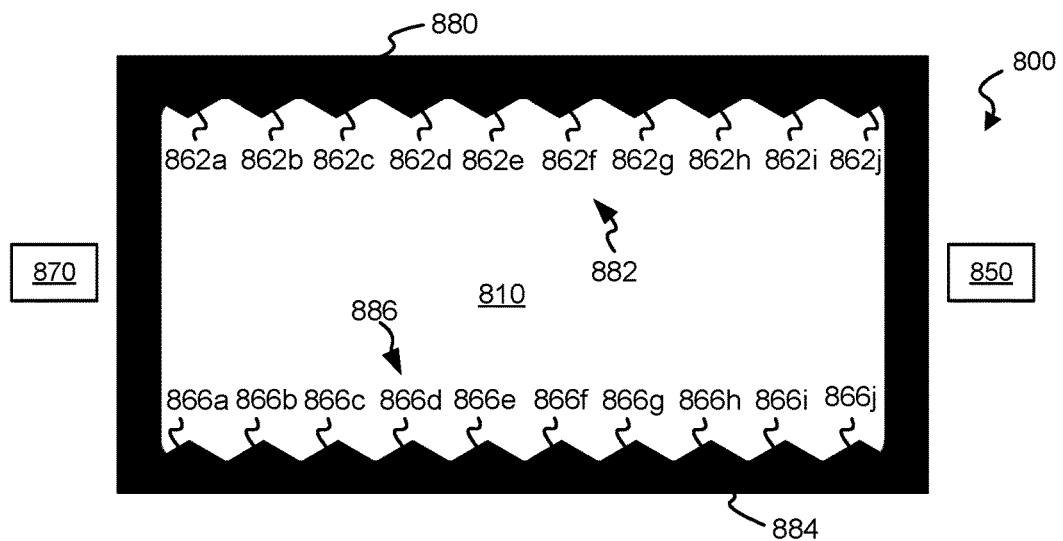
FIG. 8 depicts a top view of a particular implementation of side walls each including an uneven edge that may be used in relation to the fluidic assembly system of FIG. 1*a* in accordance with one or more embodiments of the present inventions.

Turning to FIG. 8, a top view 800 of a particular implementation of side walls 880, 884 each including an uneven edge extending into a fluidic flow chamber 810 toward another of the side walls that may be used in place of the side gaskets 120 discussed above in relation to FIG. 1a. As shown, side walls 880, 884 extend in a direction defining fluidic flow chamber 810 between a flow oscillator 850 and a suspension reservoir 870. An inner edge 882 of sidewall 880 includes a number of serrations 862 extending toward sidewall 884. Similarly, an inner edge 886 of sidewall 884 includes a number of serrations 866 extending toward sidewall 880. As push and pull forces are applied by flow oscillator 850 one or more micro-components brush up against serrations 862, 866 as they are moved with the suspension. As the micro-components brush up against serrations 862, 866 they are deflected toward a center region of fluidic flow chamber 810.

It should be noted that in some cases, chemistry such as oxidization can be used to modify or/and pattern the surfaces of the micro-components and/or the substrate including wells so that they are both hydrophilic (e.g., water contact angle <25 degrees) or at selective locations on the substrate. One of ordinary skill in the art will recognize various advantages achievable through use of different embodiments of the inventions. As just some of many advantages, lower display costs are possible as a significant cost of manufacturing a micro LED display is the time it takes to assemble micro-components into a substrate. As some embodiments offer enhancements to the rate at which a display may be assembled, the time to assemble and therefore the cost of assembly is reduced.

In conclusion, the invention provides novel systems, devices, methods and arrangements for fluidic assembly. While detailed descriptions of one or more embodiments of the invention have been given above, various alternatives, modifications, and equivalents will be apparent to those skilled in the art without varying from the spirit of the invention. For examples, while some embodiments are discussed in relation to displays, it is noted that the embodiments find applicability to devices other than displays. Therefore, the above description should not be taken as limiting the scope of the invention, which is defined by the appended claims.

What is claimed is:

1. A fluidic assembly system, the system comprising:
    a fluidic flow chamber formed over a substrate including a plurality of wells on at least a top surface of the substrate, wherein the fluidic flow chamber includes a top plate and side walls, and wherein at least the top surface of the substrate is in contact with a suspension within the fluidic flow chamber; and
    a flow oscillator operable to selectably move the suspension within the fluidic flow chamber over the top surface of the substrate in at least a first direction and a second direction, wherein the suspension includes a plurality of micro-components and a carrier liquid.

2. The fluidic assembly system of claim 1, wherein the flow oscillator is further operable to selectably move the suspension within the fluidic flow chamber at a selected magnitude of fluid velocity in a selected one of the first direction or the second direction.

3. The fluidic assembly system of claim 1, wherein the first direction is away from the flow oscillator and the second direction is toward the flow oscillator.

4. The fluidic assembly system of claim 1, wherein the top plate is at least partially transparent, the system further comprising:
    a vision system operable to capture images of the location of micro-components relative to the plurality of wells through the top plate.

5. The fluidic assembly system of claim 4, the system further comprising:
    an automated oscillation controller operable to:
        receive the images from the vision system;
        select one of the first direction or the second direction as a desired direction based at least in part on the images; and
        command the flow oscillator to produce the desired direction of flow of the suspension within the fluidic flow chamber.

6. The fluidic assembly system of claim 5, wherein the automated oscillation controller is further operable to:
    based at least in part on the images, select a desired magnitude of fluid velocity of the suspension within the fluidic flow chamber as a selected fluid velocity; and
    command the flow oscillator to produce the selected fluid velocity of the suspension within the fluidic flow chamber.

7. The fluidic assembly system of claim 1, the system further comprising:
    a suspension reservoir operable to hold a portion of the suspension outside of the fluidic flow chamber.

8. The fluidic assembly system of claim 1, wherein the micro-components are light emitting diodes.

9. The fluidic assembly system of claim 1, wherein the substrate further includes one or more control channels extending along a top surface of the substrate.

10. The fluidic assembly system of claim 9, wherein the one or more control channels extending a first distance below the top surface of the substrate, and wherein at least a subset of the plurality of wells are within one of the one or more control channels and extend as second distance below the top surface of the substrate.

11. The fluidic assembly system of claim 9, wherein the control channels are substantially parallel to the first direction and the second direction.

12. The fluidic assembly system of claim 1, wherein the top plate includes at least one deflection bar extending down toward the substrate that is substantially perpendicular to the first direction and the second direction.

13. The fluidic assembly system of claim 1, wherein at least one of the side walls includes an uneven edge extending into the fluidic flow chamber toward another of the side walls.

14. The fluidic assembly system of claim 1, wherein the flow oscillator is a pump configured to provide a range of tunable fluidic flow.

15. The fluidic assembly system of claim 1, wherein the flow oscillator is a first flow oscillator, the system further comprising:
    a second flow oscillator operable to move a suspension within the fluidic flow chamber in at least the first direction and the second direction.

16. The fluidic assembly system of claim 1, wherein the flow oscillator is a first flow oscillator, the system further comprising:
    a second flow oscillator operable to move a suspension within the fluidic flow chamber in at least a third direction and a fourth second direction, wherein the third direction is away from the second flow oscillator and the fourth direction is toward the second flow oscillator, and wherein the third direction and the fourth direction are substantially perpendicular to the first direction and the second direction.

17. A fluidic assembly system, the system comprising:
    a fluidic flow chamber formed by a substrate, a top plate, and side walls, wherein the substrate includes a plurality of wells extending below a top surface of the substrate; and
    a flow oscillator fluidically coupled to the fluidic flow chamber and configured to: pump a suspension within the fluidic flow chamber in a first direction at a first selectable magnitude of fluidic flow toward the flow oscillator, and pump the suspension within the fluidic flow chamber in a second direction at a second magnitude of fluidic flow away from the flow oscillator, wherein the suspension includes a plurality of micro-components and a carrier liquid.
    a suspension reservoir fluidically coupled to the fluidic flow chamber and configured to hold a portion of the suspension outside of the fluidic flow chamber;
    a vision system configured to capture images of the location of micro-components relative to the plurality of wells through the top plate; and
    an automated oscillation controller configured to:
        receive the images from the vision system;
        select one of the first direction and the second direction as a selected direction of flow of the suspension within the fluidic flow chamber based at least in part on the images;

select a magnitude of fluidic flow within the fluidic flow chamber as a selected magnitude of fluidic flow based at least in part on the images; and command the flow oscillator to produce the selected direction and the selected magnitude of fluidic flow of the suspension within the fluidic flow chamber.

18. The fluidic assembly system of claim 9, wherein the control channels are substantially perpendicular to the first direction and the second direction.

19. The fluidic assembly system of claim 17, wherein the first selectable magnitude is the same as the second selectable magnitude.

20. The fluidic assembly system of claim 17, wherein the first direction is away from the flow oscillator and the second direction is toward the flow oscillator.

21. The fluidic assembly system of claim 17, wherein the micro-components are light emitting diodes.

22. The fluidic assembly system of claim 17, wherein the substrate further includes one or more control channels extending along a top surface of the substrate.

23. The fluidic assembly system of claim 17, wherein the substrate further includes one or more control channels extending a first distance below the top surface of the substrate, and wherein at least a subset of the plurality of wells are within one of the one or more control channels and extend as a second distance below the top surface of the substrate.

24. The fluidic assembly system of claim 17, wherein the top plate includes at least one deflection bar extending down toward the substrate that is substantially perpendicular to the first direction and the second direction.

25. The fluidic assembly system of claim 17, wherein the flow oscillator is a first flow oscillator, the system further comprising:

a second flow oscillator operable to move a suspension within the fluidic flow chamber in at least a third direction and a fourth second direction, wherein the third direction is away from the second flow oscillator and the fourth direction is toward the second flow oscillator.

* * * * *